United States Patent [19]

Umemura

[11] Patent Number: 4,822,673

[45] Date of Patent: Apr. 18, 1989

[54] MICROWAVE DEVICE

[75] Inventor: Shizuo Umemura, Ibaraki, Japan

[73] Assignees: Fuji Photo Film Co., Ltd.; Research Development Corporation of Japan, both of Tokyo, Japan

[21] Appl. No.: 80,199

[22] Filed: Jul. 30, 1987

Related U.S. Application Data

[63] Continuation of Ser. No. 790,715, Oct. 24, 1985, abandoned.

[30] Foreign Application Priority Data

Oct. 30, 1984 [JP] Japan ................................. 59-226783

[51] Int. Cl.$^4$ .............................................. B32B 5/16
[52] U.S. Cl. ..................................... 428/328; 428/434; 428/432; 428/698
[58] Field of Search ............... 428/424, 328, 208, 434, 428/206, 426, 432, 698, 699

[56] References Cited

U.S. PATENT DOCUMENTS

| | | | |
|---|---|---|---|
| 3,333,984 | 8/1967 | Kaspaul et al. | 428/209 |
| 3,671,238 | 6/1972 | Kaspaul et al. | 430/401 |
| 4,137,361 | 1/1979 | Deffeyes et al. | 429/698 X |
| 4,243,710 | 1/1981 | Magrini et al. | 428/208 |
| 4,259,409 | 3/1981 | Arnold | 428/434 X |
| 4,304,808 | 12/1981 | Priest | 428/208 |
| 4,714,645 | 12/1987 | Kawasumi | 428/328 X |

*Primary Examiner*—Nancy A. B. Swisher
*Attorney, Agent, or Firm*—Flynn, Thiel, Boutell & Tanis

[57] ABSTRACT

A microwave device comprises a substrate and fine metal particles having diameters of 0.1 μm or smaller and arranged in a regular pattern on the substrate. In the preferred embodiment of the present invention, the substrate is subjected to electron beam irradiation in a stripe pattern and then a metal or alloy is deposited onto the irradiated area, thereby forming a regular arrangement of fine metal particle deposits which has not been successfully achieved by any prior art technique. The thus obtained device has a greatly improved high-frequency characteristics.

14 Claims, No Drawings

MICROWAVE DEVICE

This application is a continuation of U.S. Ser No. 790,715, filed Oct. 24, 1985, now abandoned.

BACKGROUND OF THE INVENTION

This invention relates to a microwave device, and more specifically to a microwave device with fine particles arranged in a regular pattern on a substrate.

As devices employed for a wavelength range of from microwaves to millimeter waves, those making use of semiconductor devices have been used primarily to date. However, their time constants are increased to hardly ignorable large levels due to an increase in their junction capacitances and series resistances when they are used at higher frequencies. Research has been underway from the viewpoint of minimizing junction areas as much as possible or developing devices which make use of point-to-point contact between metals. As one exemplarly outcome of such research, a deposition film with an island structure has been prepared under suitable conditions so that a number of MIM diodes have been brought into a mutually-connected state. Using such deposition films with the island structure, there are fabricated high-speed detectors and frequency mixers both of which can successfully respond to a wavelength range of from microwaves to the infrared range.

Furthermore, a thin film which is formed by vacuum-depositing on a substrate a superconducting metal in the form of particles can be also used as detectors and mixers which exhibit high sensitivities to a wavelength range of from microwaves to the far infrared range, because a number of Josephson junctions formed between adjacent particles are connected together in a random pattern.

In devices making use of vacuum-deposited particles, currents tend to flow along certain specific branched paths and coherent modes can hardly be established throughout their respective systems since their structures are not uniform. As a result, their detection or oscillation characteristics are not sufficient.

SUMMARY OF THE INVENTION

An object of this invention is to provide a microwave device having higher performance than that of the above-described conventional devices.

The present inventors have carried out research to accomplish the above object of the invention. That is, the object of the invention can be attained by a microwave device comprising a substrate and fine metal particles each of which has a diameter of 0.1 μm or smaller and which are arranged in a regular pattern on the substrate.

In preferred embodiments of the invention the substrate is silica, the fine metal particle is platinum, a platinum alloy or a material capable of exhibiting superconductivity at low temperatures, and the material capable of exhibiting superconductivity is Nb or Pb.

Use of the invention devices can improve high-frequency characteristics significantly compared with conventional devices.

The above and other objects, features and advantages of the present invention will become apparent from the following description and the appended claims.

DETAILED DESCRIPTION OF THE PREFERRED EMBODIMENTS

The term "arranged in a regular pattern" as used herein means that in the microwave device of this invention, the positional relations between individual fine particles and their respective adjacent particles are substantially uniform with respect to any particle. Accordingly, the contacts between adjacent fine particles are substantially uniform in state throughout the system and their particle sizes are also uniform.

As the substrate of the microwave device of this invention, it is preferred to use a material having higher surface resistance than $1\times10^{10}\Omega\cdot$cm. Silica, glass, $Al_2CO_3$, $SiO_2$ and general porcelains can be used. Among them, silica is particularly preferred. In order to provide fine particles for use in the present invention, it is possible to use a metal such as Pt, Pd, Au, Ag, Ta, Mo, Al, Ni or Ti or an alloy thereof for devices which are used at room temperature and make use of the tunnel effect. It is however preferred to use a metal or alloy having a higher melting point than 1500° C. Platinum or its alloy is especially preferred. Platinum alloys used in this invention can include Pt-Pd, Pt-Rh, Pt-Sb, Pt-Sn, Pt-Te, Pt-Tl and so on. Among them, Pt-Pd is particularly preferred. On the other hand, materials capable of exhibiting superconductivity at low temperatures are required for devices which make use of Josephson junctions. Such the materials include metals such as Nb, Pb, Al, Mo, Ga, Pa, Ta or Te, alloys such as Nb-Zr, Nb-Ta, Nb-Ti, Pb-Bi, Mo-Tc or Ta-Ti, or compounds such as $Nb_3Sn$, $Nb_3Al$, $Nb_3Ge$, $Nb_3Au$, $Nb_3Pt$, $Ta_3Sn$ or $V_3Si$. Of these, Nb or Pb is especially preferred.

The device of this invention can be fabricated, for example, in the following manner which was described in my U.S. patent application Ser. No. 752 208, filed July 3, 1985.

First of all, a substrate is exposed to a finely-focused electron beam in a high vacuum while the electron beam is scanned on the substrate in a stripe pattern. Then, the same area of the substrate is exposed to the electron beam while it is scanned on the area in a stripe pattern perpendicular to the previous stripe pattern. Thereafter, a material capable of forming fine particles is vacuum-deposited on the substrate in the form of a thin film. By heating the film-bearing substrate to a higher temperature than 100° C., the device of this invention is completed with fine particles arranged in a grid-like pattern. In this process, the amount of the material to be deposited, the heating temperature and the interval of the scanned stripes are appropriately adjusted so that the junctions between adjacent fine particles can be varied to obtain the intended microwave device. In general, the film thickness and heating temperature may preferably be 20 Å–500 Å and 30° C.–1,000° C. respectively.

According to the microwave device of this invention, a coherent mode can be excited throughout the system because the junctions between adjacent particles, which form diodes, are uniform in nature and, moreover, since the state of each junction can be controlled as desired, an ideal state of point-to-point contact can be established and the electric capacitance at each junction can hence be reduced to an extremely smaller level than that of conventional devices. Reflecting these features, the device of this invention can be expected to exhibit significantly better properties in both detection and oscillation characteristics for high frequencies than conventional devices.

The present invention will hereinafter be described in further detail on the basis of the following Examples. The following Examples were effected using platinum-palladium alloy or Nb. Needless to say, these Examples can be also practiced in the same manner even if platinum-palladium alloy or Nb is replaced by platinum, Pb, or any of the materials exemplified above as materials useful for the formation of fine metal particles.

EXAMPLE 1

A 20 $\mu$m ×20 $\mu$m area of a silica substrate was irradiated for 3 minutes with an electron beam with a diameter of about 50 Å scanned in a striped pattern with a spacing of 100 Å between scanning lines under an acceleration voltage of 30 kV and a current of 10 $\mu$A. This irradiation of the electron beam was blanked to avoid irradiation whenever the beam was shifted from one scanning line to another.

The same area was again irradiated in the same conditions as those employed in the above irradiation except that the spacing between the scanning lines was broadened to 150 Å and the scanning direction was changed to the direction perpendicular to the scanning direction in the above irradiation. After vacuum-depositing a platinum-palladium alloy on the irradiated area of the substrate to a thickness of 70 Å, the substrate was heated to 600° C.

An observation of the surface of the substrate by a scanning electron microscope indicated a regular arrangement in which the fine particles of 90–100 Å are disposed in each row where particles contact with each other.

Gold electrodes were then attached to the thus-formed thin film to fabricate a microwave solid-state device. This device will be designated by "A".

Comparative Example 1

After vacuum-depositing a platinum-palladium alloy onto a 20 $\mu$m ×20 $\mu$m area of a silica substrate to a thickness of 70 Å, the substrate was heated to 600° C.

An observation of the surface of the substrate by the scanning electron microscope indicated that fine particles of 70–120 Å are distributed at random where the particles contact with each other.

Gold electrodes were then attached to the thus-formed thin film to fabricate a microwave solid-state device. This device will be designated by "B".

The detection sensitivities of the devices "A" and "B", which were obtained in the above Example and Comparative Example respectively, for an electromagnetic wave of 50 GHz were measured. As a result, it was found that when the same bias voltage was applied, the detected sensitivity of the device "A" is 7–10 times higher than the device "B".

EXAMPLE 2

A 20 $\mu$m ×20 $\mu$m area of a silica substrate was irradiated for 3 minutes with an electron beam with a diameter of about 50 Å scanned in a striped pattern with a spacing of 500 Å between scanning lines under an acceleration voltage of 30 kV and a current of 10 $\mu$A. During this irradiation, the electron beam was subjected to blanking to avoid irradiation whenever the beam was shifted from one scanning line to another.

The same area was again irradiated under the same conditions as those employed in the above irradiation except that the spacing between the scanning lines was broadened to 700 Å and the scanning direction was changed to the direction perpendicular to the scanning direction in the above irradiation. After vacuum-depositing Nb on the irradiated area of the substrate to a thickness of 100 Å, the substrate was heated to 400° C.

An observation of the surface of the substrate by the scanning electron microscope indicated a regular arrangement in which the fine particles of about 500 Å are disposed in each row where the particles contact with each other.

Gold electrodes were then attached to the thus-formed thin film to fabricate a microwave solid-state device. This device will be designated by "C".

Comparative Example 2

After vacuum-depositing Nb alloy onto a 20 $\mu$m ×20 $\mu$m area of a silica substrate to a thickness of 100 Å, the substrate was heated to 400° C.

An observation of the surface of the substrate by the scanning electron microscope indicated that fine particles of 300–400 Å are distributed at random where the particles contact with each other.

Gold electrodes were then attached to the thus-formed thin film to fabricate a microwave solid-state device. This device will be designated by "D". The devices "C" and "D", which were obtained in the above Example 2 and Comparative Example 2 respectively, were cooled to 4.2° K. Their detection sensitivities were then measured for the 10 GHz band. The sensitivity of the device "C" was found to be about 20 times better than the device "D".

Having now fully described the invention, it will be apparent to one of ordinary skill in the art that many changes and modifications can be made thereto without departing from the spirit or scope of the invention as set forth herein.

What is claimed is:

1. A microwave device consisting essentially of a substrate consisting of a material selected from the group consisting of $Al_2O_3$, $SiO_2$ and porcelain, and a thin layer deposited on said substrate and having a thickness of from 20 to 500 Angstrom units, said thin layer consisting of fine metal particles wherein each deposited fine metal particle contacts adjacent deposited fine metal particles, said fine metal particles being of a uniform size of not greater than 0.1 $\mu$m in diameter, said fine metal particles being deposited so that the positional relationships between each fine metal particle and its respectively adjacent fine metal particles are substantially uniform with respect to any of said fine metal particles and the contacts between adjacent fine metal particles are substantially uniform point-to-point contacts throughout said microwave device, said fine metal particles being selected from the group consisting of pt and alloys thereof, Nb-Zr, Nb-Ta, Nb-Ti, Pb-Bi, Mo-Tc, Ta-Ti, $Nb_3Sn$, $Nb_3Al$, $Nb_3Ge$, $Nb_3Au$, $Nb_3Pt$, $Ta_3Sn$ and $V_3Si$.

2. A microwave device as claimed in claim 1, wherein said fine metal particles are selected from the group consisting of platinum and alloys of platinum.

3. A microwave device as claimed in claim 1, wherein said fine metal particles consist of a material selected from the group consisting of Nb-Zr, Nb-Ta, Nb-Ti, Pb-Bi, Mo-Tc, Ta-Ti, $Nb_3Sn$, $Nb_3Al$, $Nb_3Ge$, $Nb_3Au$, $Nb_3Pt$, $Ta_3Sn$ and $V_3Si$.

4. A microwave device as claimed in claim 1, wherein said substrate is made of silica.

5. A microwave device as claimed in claim 4, wherein said fine metal particles are selected from the group consisting of platinum and alloys of platinum.

6. A microwave device as claimed in claim 4, wherein said fine metal particles consist of a material selected from the group consisting of Nb-Zr, Nb-Ta, Nb-Ti, Pb-Bi, Mo-Tc, Ta-Ti, Nb$_3$Sn, Nb$_3$Al, Nb$_3$Ge, Nb$_3$Au, Nb$_3$Pt, Ta$_3$Sn and V$_3$Si.

7. A microwave device as claimed in claim 1, wherein said fine metal particles are arranged in a two-dimensional grid-like pattern on said substrate.

8. A microwave device as claimed in claim 1, in which said fine metal particles are free of binder, vehicle and solvent.

9. A microwave device as claimed in claim 1, wherein said fine metal particles are deposited on said substrate by vacuum deposition.

10. A microwave device consisting essentially of a substrate, a thin layer deposited on said substrate and having a thickness of from 20 to 500 Angstrom units, said thin layer consisting of fine metal particles wherein each deposited fine metal particle contacts adjacent deposited fine metal particles, said fine metal particles being of a uniform size of not greater than 0.1 μm in diameter, said fine metal particles being deposited so that the positional relationships between each fine particle and its adjacent respective particles are substantially uniform with respect to any of said fine metal particles and the contacts between adjacent fine metal particles are substantially uniform point-to-point contacts throughout said microwave device, said substrate consisting of a material selected from the group consisting of Al$_2$O$_3$, SiO$_2$ and porcelain, and said fine metal particles being selected from the group consisting of Pt and alloys thereof, Nb-Zr, Nb-Ta, Nb-Ti, Pb-Bi, Mo-Tc, Ta-Ti, Nb$_3$Sn, Nb$_3$Al, Nb$_3$Ge, Nb$_3$Au, Nb$_3$Pt, Ta$_3$Sn and V$_3$Si, wherein said microwave device has been prepared by exposing said substrate to a finely-focused electron beam scanned in a regular pattern on the surface of said substrate, and then vapor depositing said metal particles onto said substrate on those portions of said substrate that have been exposed to said electron beam, and then heating said substrate to 100° C. or higher.

11. A microwave device consisting of a substrate and vapor-deposited fine metal particles deposited thereon, said particles being free of binders, vehicles and solvents, said particles being of a uniform diameter of no greater than 0.1 μm, wherein said substrate consists of a material selected from the group consisting of Al$_2$O$_3$, SiO$_2$ and porcelain and said fine metal particles consist of a metal selected from the group consisting of Pt and alloys thereof, Nb-Zr, Nb-Ta, Nb-Ti, Pb-Bi, Mo-Tc, Ta-Ti, Nb$_3$Sn, Nb$_3$Al, Nb$_3$Ge, Nb$_3$Au, Nb$_3$Pt, Ta$_3$Sn and V$_3$Si, wherein said microwave device has been prepared by the process of irradiating portions of said substrate with an electron beam, vapor depositing said metal particles on the irradiated portions of said substrate, said vapor-deposited metal particles being deposited on said substrate in a layer having a mean thickness of 20–500 Å and in a manner such that said metal particles are regularly arranged on said substrate, to positionally relate adjacent particles in substantial uniformity and to dispose said particles in contact with adjacent particles in substantial uniformity throughout said microwave device, and then heating said device to a temperature in the range of 30°–1,000° C.

12. A microwave device, as claimed in claim 11 wherein said substrate is irradiated by an electron beam scanned on said substrate in a predetermined pattern of two sets of parallel, spaced-apart lines, wherein the first and second sets of lines are perpendicular to each other.

13. A microwave device as claimed in claim 11 wherein said substrate has a surface resistivity of at least $1 \times 10^{10}$ ohm.cm, said substrate having adhering thereon an electrically conductive pattern consisting of said fine metal particles, said fine metal particles having substantially uniform particle sizes, the positional relations between each individual fine metal particle and the fine metal particles adjacent thereto being substantially uniform throughout the pattern and the electrical contacts between adjacent fine metal particles in the pattern being substantially uniform point-to-point contacts throughout the pattern.

14. A microwave device as claimed in claim 13 in which the contacts between adjacent particles are point-to-point contacts which form diodes.

* * * * *